United States Patent

Hayashi et al.

[11] Patent Number: 5,833,875
[45] Date of Patent: Nov. 10, 1998

[54] PIEZOELECTRIC CERAMICS

[75] Inventors: Kohichi Hayashi, Shiga-ken; Kenichi Nada, Hikone; Kosuke Shiratsuyu, Ohomihachiman, all of Japan

[73] Assignee: Murata Manufacturing Co., Ltd., Kyoto, Japan

[21] Appl. No.: 949,210

[22] Filed: Oct. 10, 1997

Related U.S. Application Data

[63] Continuation of Ser. No. 633,575, Apr. 17, 1996, abandoned.

[30] Foreign Application Priority Data

Apr. 21, 1995 [JP] Japan .................................. 7-120929

[51] Int. Cl.$^6$ .................................................. H01L 41/10
[52] U.S. Cl. .................................. 252/62.9 PZ; 501/134
[58] Field of Search ...................... 252/62.9 PZ; 501/134

[56] References Cited

FOREIGN PATENT DOCUMENTS 63-185080  7/1988  Japan .

*Primary Examiner*—Melissa Bonner
*Attorney, Agent, or Firm*—Ostrolenk, Faber, Gerb & Soffen, LLP

[57] ABSTRACT

A piezoelectric ceramic which maintains a high piezoelectric property in a composition having MPB structure and has an excellent ability for stabilizing the resonant frequency is provided. The piezoelectric ceramic has a solid solution expressed by the general expression $xPbTiO_3$—$(1-x)PbZrO_3$ as its main component. The value of x in the above general expression causes the piezoelectric ceramic to have a composition having the morphotropic phase boundary structure. A ceramic having a spinel type structure is dispersed within the structure of the piezoelectric ceramic. The amount of the ceramic having the spinel type structure existing in the structure is set at about 5 volume % or less. $Co_2TiO_4$, $Mn_3O_4$, $Fe_3O_4$, $Mg_2TiO_4$ and a ceramic having a compound spinel type structure which is a solid solution of them can be used as the ceramic having the spinel type structure.

9 Claims, 3 Drawing Sheets

Co = 1.6 wt%

PIEZOELECTRIC CERAMICS

This is a continuation of application Ser. No. 08/633,575 filed on Apr. 17, 1996, now abandoned.

BACKGROUND OF THE INVENTION

1. Field of the Invention

The present invention relates to piezoelectric ceramics and more particularly to piezoelectric ceramics used for ceramic filters, ceramic oscillators, discriminators, surface acoustic wave resonators or the like.

2. Description of Prior Art

A piezoelectric ceramic having a lead titanate zirconate ($PbTiO_3$—$PbZrO_3$; hereinafter referred to as "PZT") as a main component has been widely used as a ceramic material having piezoelectric properties (piezoelectric ceramic) employed, for instance, in ceramic filters and ceramic oscillators.

Recently, a number of piezoelectric ceramics to which various third components or additives are added have been proposed in order to improve the piezoelectric characteristic. One such piezoelectric ceramic is where $Pb(Mn_{1/3}Nb_{2/3})O_3$, $Pb(Mg_{1/3}Nb_{2/3})O_3$ or the like is solid-solubilized as the third component.

The crystal structure of a piezoelectric ceramic containing such PZT as the main component changes depending on the ratio of $PbTiO_3/PbZrO_3$ and takes either a rhombohedral crystal structure or a tetragonal crystal structure. The phase boundary between the rhombohedral structure and the tetragonal structure also called the Morphotropic Phase Boundary ("MPB"). It is known that excellent piezoelectric properties can be obtained in a composition having the ratio of $PbTiO_3/PbZrO_3$ realizing a structure close to MPB ("MPB structure"). For example, when a piezoelectric ceramic having a composition realizing the MPB structure is used as a band-pass filter, the band width of the filter is broader.

However, a PZT system piezoelectric ceramic having a composition realizing the MPB structure has a problem in that the temperature dependency of a resonant frequency and anti-resonant frequency is high. For example, the pass-band of a ceramic filter using such piezoelectric ceramic depends significantly on the temperature. Accordingly, even though the band-pass filter using the PZT system piezoelectric ceramic having the composition realizing the MPB structure has the aforementioned advantage, its use is limited because the temperature dependency of the frequency is significant.

SUMMARY OF THE INVENTION

It is an object of the present invention to solve the aforementioned problem by providing a piezoelectric ceramic in which the dependency of pass-band to temperature change is reduced while having a composition realizing the MPB structure and an excellent piezoelectric property and which may be suitably used for a ceramic filter whose pass-band depends less on temperature and a ceramic oscillator having a stable oscillating frequency.

In order to achieve the aforementioned object, according to the present invention, there is provided a piezoelectric ceramic having a solid solution expressed by a general expression: $xPbTiO_3$—$(1-x) PbZrO_3$ as its main component, wherein x in the above general expression has a value which causes the piezoelectric ceramic to have a composition in the vicinity of the MPB and in which a ceramic having a spinel type structure exists within the structure thereof.

According to one aspect of the present invention, the content of the ceramic having the spinel type structure existing in the structure is set at about 5 volume % or less, preferably about 0.1 to 4.8%.

According to another aspect of the present invention, at least one of $Co_2TiO_4$, $Mn_3O_4$, $Fe_3O_4$, $Mg_2TiO_4$ and a spinel type structure solid solution of them is used as the ceramic having the spinel type structure.

The reason why the amount of the ceramic having the spinel type structure (hereinafter referred simply as "spinel ceramic") existing within the piezoelectric ceramic is kept in a range of about 5 volume % or less is because the specific resistance of the obtained piezoelectric ceramic is lowered and it becomes difficult to implement a polarization process if the amount of the spinel ceramic exceeds 5 volume %.

It is noted that although a detailed mechanism for bringing about a stability of temperature coefficient of the resonant frequency is not necessarily clear in the inventive piezoelectric ceramic, it is believed that the inventive piezoelectric ceramic can achieve the excellent. thermal stability while maintaining a high piezoelectric property in a composition range in the vicinity of the MPB because a spinel phase which differs from a perovskite phase is formed during the sintering process of the piezoelectric ceramic and it cancels the instability of the crystal structure caused by phase change in a singular phase of the perovskite phase by some means.

The above and other related objects and features of the invention will be apparent from a reading of the following description and the accompanying drawings.

DETAILED DESCRIPTION OF THE INVENTION

Figure 1:
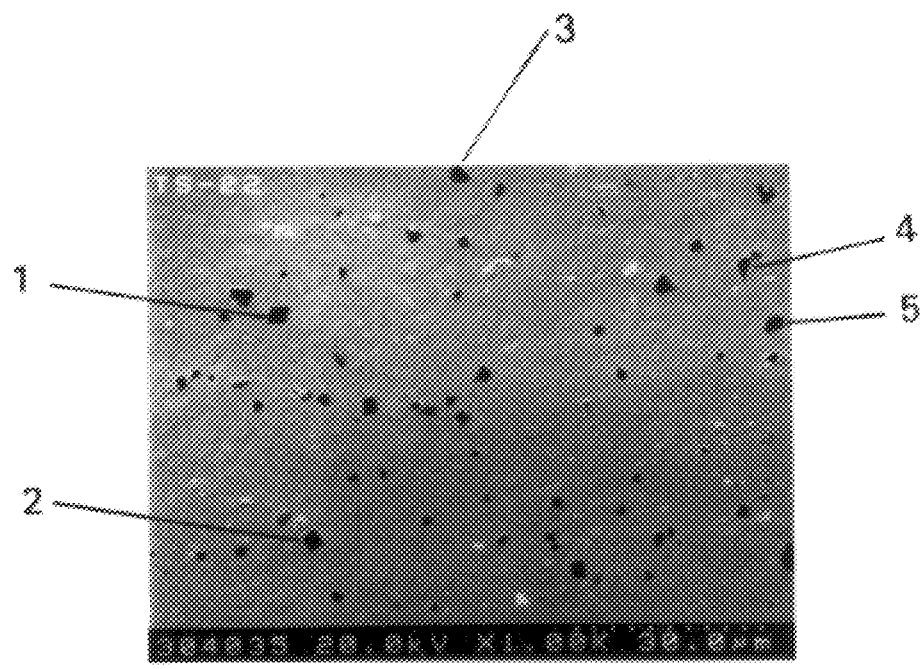
FIG. 1 is an electron microscope (SEM) picture of a polished plane of a piezoelectric ceramic showing the crystal structure thereof according to one embodiment of the present invention.

The present invention will be explained below more concretely by showing a preferred embodiment thereof.

It is noted that the present embodiment will be explained by exemplifying a piezoelectric ceramic containing, as a third component, $Pb(Mn_{1/3}Nb_{2/3})O_3$ expressed by the following general expression (1):

$$0.97\{xPbTiO_3\text{—}(1\text{-}x)PbZrO_3\}\text{—}0.03Pb(Mn_{1/3}Nb_{2/3})O_3$$

and in which a ceramic having a spinel type structure expressed by the following general expression:

$$Co_2TiO_4$$

is dispersed.

(1) Preparation of Piezoelectric Ceramic Powder

Powders of PbO or $Pb_3O_4$, $TiO_2$, $ZrO_2$, $MnO_2$ and $Nb_2O_3$ were prepared as starting raw materials. Those materials were weighed so that the value of x in the general expression (1) takes the value shown in Table 1 below, wet mixed using a ball mill, dehydrated, dried, calcined for two hours in 850° to 1000° C. and then ground to obtain calcined piezoelectric ceramic powder A.

TABLE 1

| Sample No. | Composition | | *$\epsilon$ | kp (%) | Cfr.p (ppm/°C.) | Spinel Type Structure Ceramic (volume %) |
|---|---|---|---|---|---|---|
| | X | Spinel Type Structure Ceramic (weight %) | | | | |
| *1 | 0.46 | 0.0 | 1390 | 56.3 | −169 | 0.0 |
| *2 | 0.47 | 0.0 | 1580 | 53.7 | 265 | 0.0 |
| 3 | 0.47 | 0.1 | 1230 | 58.1 | 62 | 0.1 |
| 4 | 0.48 | 0.2 | 1430 | 58.7 | 36 | 0.3 |
| 5 | 0.48 | 0.4 | 1330 | 58.6 | 31 | 0.6 |
| 6 | 0.48 | 0.8 | 1360 | 56.2 | −9 | 0.9 |
| 7 | 0.49 | 0.8 | 1410 | 57.3 | 20 | 1.1 |
| 8 | 0.49 | 1.5 | 1110 | 56.3 | −10 | 2.0 |
| 9 | 0.50 | 1.5 | 1450 | 57.4 | 8 | 2.1 |
| 10 | 0.51 | 3.0 | 1360 | 55.9 | −3 | 4.8 |
| 11 | 0.52 | 3.0 | 1190 | 54.0 | 12 | 4.8 |
| *12 | 0.52 | 4.0 | 680 | — | — | 5.8 |
| *13 | 0.53 | 4.0 | 700 | — | — | 5.6 |
| *14 | 0.53 | 5.0 | 490 | — | — | 7.2 |

Remarks: For $\epsilon$ of sample Nos. 12, 13 and 14 from which no piezoelectric property could be observed, $\epsilon$ of the samples before polarization is shown.

It is to be noted that although the above-mentioned oxides have been used as the starting materials of the calcined powder A in the embodiment described above, the starting materials are not limited only to those and various materials such as carbonates which become the above-mentioned oxide may be used.

(2) Preparation of Spinel Ceramic Powder

CoO and $TiO_2$ powders were prepared as starting materials of the spinel ceramic powder to be mixed with the above-mentioned calcined piezoelectric ceramic powder A, were weighed so as to meet the composition of the above-mentioned general expression (2), wet mixed using a ball mill, dehydrated, dried, calcined for two hours in 850° to 1000° C. and ground to obtain calcined spinel ceramic powder B.

(3) Creation of Piezoelectric Ceramic Containing Spinel Ceramic

The piezoelectric ceramic powder A and the spinel ceramic power B prepared as described above were mixed in the ratio as shown in Table 1 below, ground together with an organic binder such as vinyl acetate emulsion, mixed and dried to form a granulate. Then, the granular powder thus obtained was molded into a disc having a 12 mm diameter and 1 mm thickness under a pressure of about 1000 kg/cm². A piezoelectric ceramic was obtained by firing the molded disc for two hours in 1150° to 1300° C. Silver electrodes were baked on the both sides of the piezoelectric ceramic and a polarization process was implemented under the conditions of 60 to 200° C. of temperature and 1.5 to 5 kV/mm for five to 30 minutes.

FIG. 1 is an SEM picture of a polished plane showing the crystal structure of the piezoelectric ceramic sample No. 7 thus obtained. In FIG. 1, dark portions 1 through 5 and others are ceramics having the spinel type structure.

Figure 2:
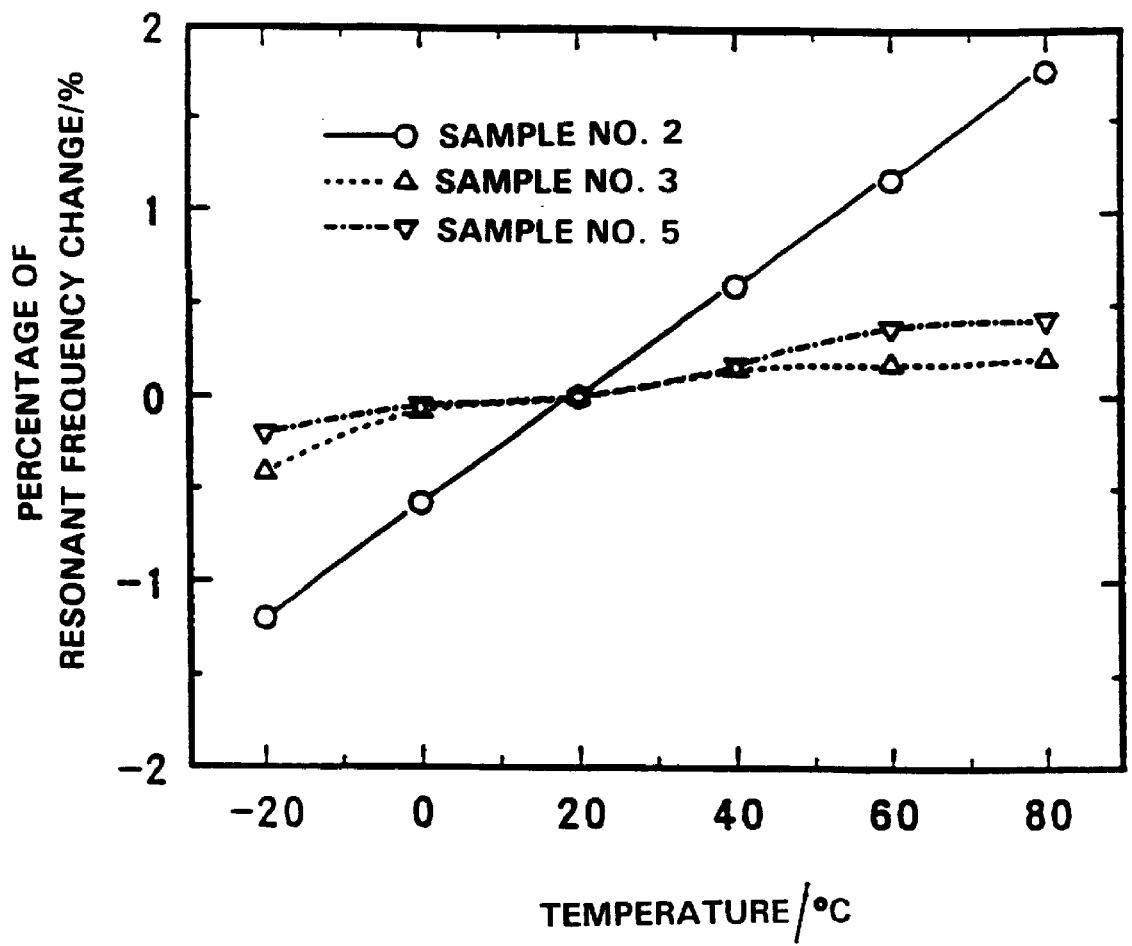
FIG. 2 is an X-ray diffraction chart of the piezoelectric ceramic of one embodiment of the present invention.

FIG. 2 is an X-ray diffraction chart of the piezoelectric ceramic sample No. 7. In FIG. 2, peaks marked with O are those of PZT and peaks marked with X are those of the ceramic having the spinel type structure.

It can be seen from FIGS. 1 and FIG. 2 described above that a ceramic having a spinel type structure exists within the obtained piezoelectric ceramic.

In this embodiment, each composition has the MBP structure. In a pure PZT, it is known that a composition whose x value is about 0.52 can be defined as one having the MPB structure. When additives such as the third component or the spinel structure are present, the x value which realizes the MPB structure may vary in accordance with the amount of the additives.

The x value realizing the MPB structure is determined by a X-ray analysis in which structures of a series of compositions having various x values are observed.

(4) Measurement of Characteristics

Characteristics of the piezoelectric ceramic to which the polarization process was implemented as described above were measured with respect to dielectric constant ($\epsilon$), an electromechanical coupling factor (kp) of radial oscillation and a temperature coefficient (Cfr.p) of the resonant frequency of the radial oscillation. Table 1 above shows the results. It is noted that in Table 1, those sample Nos. marked with "*" are comparative examples which are outside of the scope of the present invention and the other samples are embodiments within the scope of the present invention.

Figure 3:
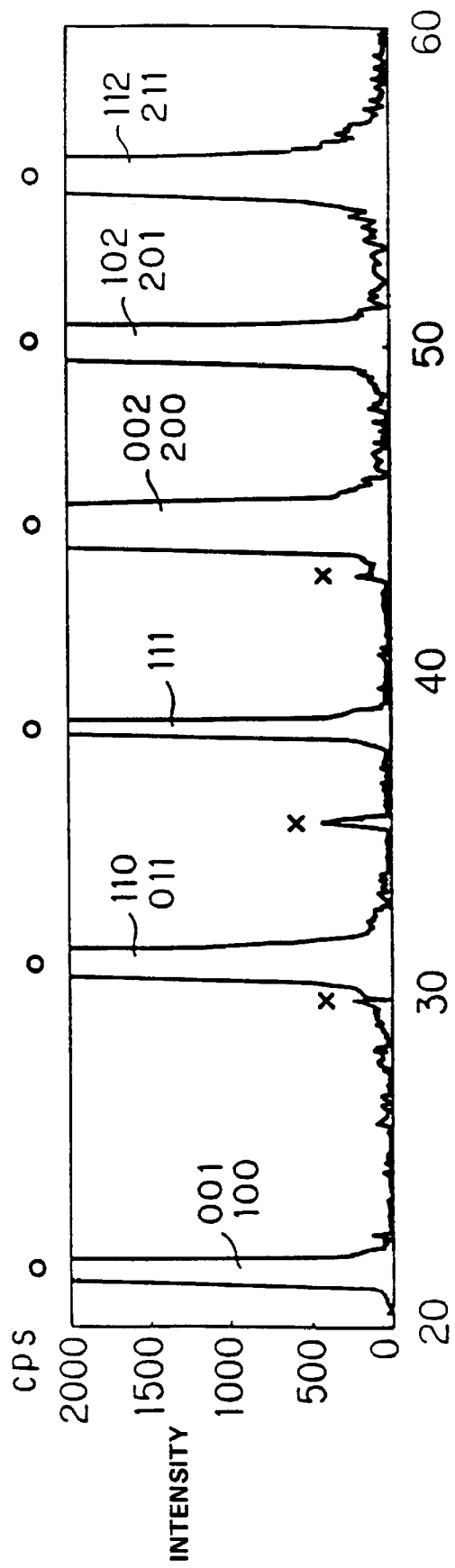
FIG. 3 is a graph showing the relationship between temperature and rate of change of resonant frequency of radial oscillation of a sample (sample No. 2) of a comparative example and those of the invention (sample Nos. 3 and 5).

FIG. 3 shows the relation between temperature and percentage of resonant frequency change of radial oscillation of a sample (sample No. 2) of the comparative example and samples (sample Nos. 3 and 5) of the invention.

Samples Nos. 12, 13 and 14 could not be polarized because the specific resistance of the samples were small. The $\epsilon$ set forth is the value prior to polarization.

As it is apparent from Table 1 and FIG. 3, while the percentage of the resonant frequency change increases in the piezoelectric ceramic of the comparative example, the change is reduced in the piezoelectric ceramic of the present invention without lowering the electromechanical coupling factor.

It is noted that although the ceramic having PZT—Pb $(Mn_{1/3}Nb_{2/3})O_3$ as the main and third components has been explained in the embodiment described above, the piezoelectric ceramic of the present invention is not confined only to that. That is, it is possible to apply the present invention to various piezoelectric ceramics including the MPB composition such as a two component PZT system or two component PZT system to which $Pb(Mg_{1/3}NB_{2/3})O_3$ or $Pb(Ni_{1/3}NB_{2/3})O_3$ has been solid-solubilized.

Further, the type of the ceramic having the spinel type structure which exists in the piezoelectric ceramic of the present invention is also not confined only to the $Co_2TiO_4$ described above. That is, it is possible to use $Mn_3O_4$, $Fe_3O_4$, $Mg_2TiO_4$ or the like and it is also possible to use a ceramic having a compound spinel type structure which is a solid solution of two or more of them.

Further, according to the present invention, not only the temperature dependence of the resonant frequency of the radial oscillation of the disc piezoelectric ceramic described above, but also the temperature dependence of the resonant frequency of perpendicular oscillation and thickness sliding oscillation may be reduced.

The present invention is not limited to the embodiment described above in other aspects. That is, it may be applied or modified in various ways in terms of the manufacturing conditions such as the sintering temperature and time and the shape and dimensions of the piezoelectric ceramic within the scope of the spirit of the present invention.

As described above, because a ceramic having the spinel type structure exists within the structure of the PZT system piezoelectric ceramic which is expressed by $xPbTiO_3$—$(1-x)PbZrO_3$ and in which x, i.e. the ratio of Ti/Zr, has a value which realizes a structure including MPB structure, the temperature dependence of the resonant frequency in the piezoelectric ceramic of the present invention is reduced while maintaining the high piezoelectric property of the composition.

While a preferred embodiment has been described, variations thereto will occur to those skilled in the art within the scope of the present inventive concepts which are delineated by the following claims.

What is claimed is:

1. A piezoelectric ceramic comprising
   (a) a solid solution of a ceramic main component expressed by the general expression $xPbTiO_3$—$(1-x)PbZrO_3$, wherein x is a value which causes said ceramic main component to have a composition of about the morphotropic phase boundary structure; and
   (b) a ceramic having spinel structure, said ceramic dispersed within said solid solution.

2. The piezoelectric ceramic according to claim 1, wherein said ceramic having the spinel structure is about 5 volume % or less.

3. The piezoelectric ceramic according to claim 2, wherein said ceramic having the spinel structure is at least one member of the group consisting of $Co_2TiO_4$, $Mn_3O_4$, $Fe_3O_4$, $Mg_2TiO_4$ and a spinel type structure ceramic which is a solid solution of two or more of the group members.

4. The piezoelectric ceramic according to claim 3, wherein said ceramic having the spinel structure is about 0.1 to 4.8 volume %.

5. The piezoelectric ceramic according to claim 1, wherein said ceramic having the spinel structure is about 0.1 to 4.8 volume %.

6. The piezoelectric ceramic according to claim 5, wherein said ceramic having the spinel structure is $Co_2TiO_4$.

7. The piezoelectric ceramic according to claim 6 wherein x is about 0.47 to 0.52.

8. The piezoelectric ceramic according to claim 1, wherein said ceramic having the spinel structure comprises $Co_2TiO_4$.

9. The piezoelectric ceramic according to claim 8, wherein said ceramic having the spinel structure is a solid solution of at least two members of the group consisting of $Co_2TiO_4$, $Mn_3O_4$, $Se_3O_4$ and $Mg_2TiO_4$.

* * * * *